United States Patent [19]

Di Passio et al.

[11] Patent Number: 4,533,610

[45] Date of Patent: Aug. 6, 1985

[54] METHOD OF MANUFACTURE OF A COLOR TELEVISION TUBE HAVING LOW SCREEN REFLECTANCE FOR AMBIENT LIGHT

[75] Inventors: Attilio Di Passio, Sora; Antimo Pezzulo, Miravalle, both of Italy

[73] Assignee: Videocolor, Montrouge, France

[21] Appl. No.: 622,824

[22] Filed: Jun. 21, 1984

[30] Foreign Application Priority Data

Jun. 24, 1983 [FR] France ............... 83 10498

[51] Int. Cl.$^3$ ............................... G03C 5/00
[52] U.S. Cl. ................................. 430/25; 427/54.1
[58] Field of Search ................ 427/54.1; 430/25

[56] References Cited

U.S. PATENT DOCUMENTS

| | | | |
|---|---|---|---|
| 3,788,846 | 1/1974 | Mayaud et al. | 430/25 |
| 3,841,876 | 10/1974 | Takemoto et al. | 430/25 |
| 3,998,638 | 12/1976 | Griswold et al. | 430/25 |
| 4,234,669 | 11/1980 | Pearlman | 430/25 |
| 4,263,384 | 4/1981 | Tumita et al. | 430/25 |
| 4,369,241 | 1/1983 | Odaka et al. | 430/25 |

FOREIGN PATENT DOCUMENTS 77976  5/1983  European Pat. Off. .

Primary Examiner—James R. Hoffman
Attorney, Agent, or Firm—Pollock, Vande Sande & Priddy

[57] ABSTRACT

In order to deposit an antireflection layer between the phosphor strips of the screen of a color television tube and on the face-plate flange, a photosensitive substance is applied on the internal face of the face-plate and is then exposed to radiation-hardening at the phosphor-strip locations, whereupon the non-hardened portions are removed. The flange and face-plate are then coated with the antireflection layer, $H_2O_2$ is deposited in order to destroy the hardened strips which are finally removed together with their antireflection coating. Deionized water, for ensuring that the film of hardened photosensitive material which has formed on the flange is made uniform, is spray-deposited on the flange prior to deposition of photosensitive substance. After deposition of the antireflection layer, deionized water is also sprayed onto this layer prior to application of the oxygenated water. The destructive activity of the oxygenated water on the film is thus reduced.

5 Claims, 6 Drawing Figures

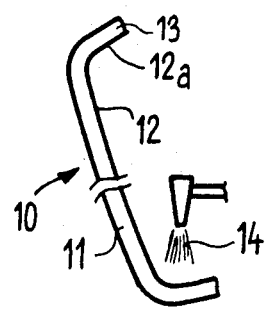
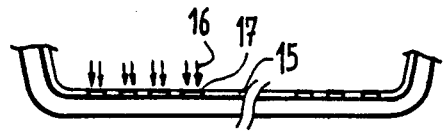
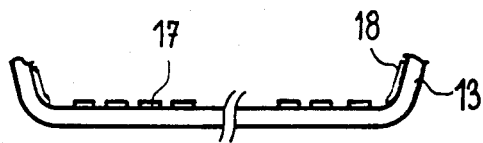
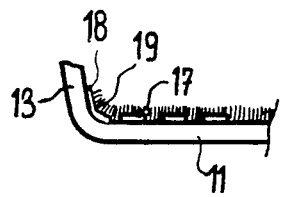
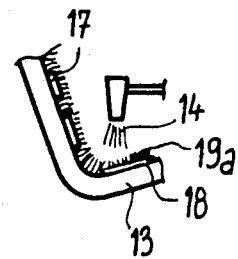
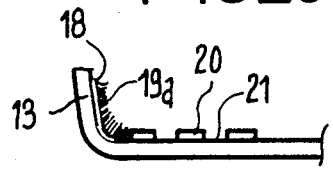

METHOD OF MANUFACTURE OF A COLOR TELEVISION TUBE HAVING LOW SCREEN REFLECTANCE FOR AMBIENT LIGHT

BACKGROUND OF THE INVENTION

1. Field of the Invention

The invention relates to a method of manufacture of a color television tube having low screen reflectance and to a tube obtained by means of this method.

2. Description of the Prior Art

The screen of a color television tube is mainly formed of vertical phosphor strips which are intended to emit light having respectively red, green and blue colors when they are excited by electron beams produced by the guns within the tube. These luminescent strips are not usually joined together but are separated by neutral strips, that is to say in which there is no phosphor material. The entire array of strips is coated with an aluminum layer which makes it possible in particular to reflect in the forward direction, that is to say toward the viewer, the light emitted in the backward direction by the phosphors. However, this aluminum layer constitutes in the neutral zones a mirror which reflects ambient light, thus impairing the quality and especially the contrast of the image. In order to overcome this disadvantage, an antireflection black layer formed especially of graphite is deposited between the phosphor strips prior to formation of the aluminum layer. This operation which consists in depositing a black layer in accordance with the invention is known as a "Matrix process".

The antireflection black layer is also deposited on the internal face of the flange or skirt of the faceplate (front portion of the tube on which the screen is formed) which joins said face-plate to the conical portion of the tube. In fact, reflections of ambient light from said flange could be a cause of disturbance for the viewer, especially when said flange is visible or in other words located outside the cabinet of the television receiver.

It has been observed that the known method of formation of the black antireflection layer has sometimes given unsatisfactory results since the deposit is not always uniform and can even exhibit blisters or cracks. Furthermore, this black layer is not of sufficient thickness.

The invention improves the known method in such a manner as to overcome this disadvantage. Provision is accordingly made for a uniform antireflection black layer of substantial thickness on the internal face of the face-plate. Furthermore, the method in accordance with the invention is inexpensive and can readily be employed for large-scale manufacture.

In order to gain a clear understanding of the invention and before describing the improvement, the known method of formation of antireflection layers will first be recalled.

The internal face of the front panel (faceplate and flange) of the tube is first washed and dried.

There is then applied on said internal face a photosensitive substance known as a photoresist which has the property of hardening when it is illuminated with ultraviolet (UV) radiation and of permitting removal by washing with water if it has not been illuminated. The photosensitive substance thus deposited is then dried, whereupon those zones of said substance which are placed at the future locations of the luminescent strips are then exposed to the UV radiations. Development with water is then carried out. Only hardened strips then remain on the internal face of the face-plate at the locations corresponding to subsequent deposition of the phosphor strips. Graphite in suspension in water is then applied on the internal face of the front panel. The strips of hardened photosensitive material, the glass which is in principle in the bare state between said strips as well as the face-plate flange are therefore all covered at the same time by the graphite just mentioned.

After drying, the next operation consists in spraying an oxidizing solution having a base of hydrogen peroxide $H_2O_2$ with a view to producing a chemical attack on the hardened photosensitive substance which has remained on the glass beneath the graphite layer. Lastly, after a final development which consists in injecting water under pressure, the hardened photoresist which has been chemically attacked by the oxidizing solution is detached from the glass, thus carrying away the graphite coating. Only the graphite then remains on the face-plate and on the flange at the required locations, that is to say at the locations between the phosphor strips and on the flange.

SUMMARY OF THE INVENTION

The invention is based on the assumption that the poor quality of the graphite deposit on the face-plate flange arises from the following cause: at the time of exposure to ultraviolet radiation, scattered light reaches said flange, thus resulting in the formation of a thin film of hardened photoresist on said flange. This film is not uniform and may exhibit blisters, bubbles or cracks which produce an unattractive appearance for the viewer after deposition of the graphite. Finally, during the last development operation, the oxidizing solution attacks said film, thus impairing the graphite layer which covers said solution.

In order to overcome this disadvantage or in other words in order to obtain a graphite layer of excellent quality on the flange, the invention contemplates means for ensuring uniformity and preferably greater fineness of the film of hardened photosensitive substance on the flange and/or means which are deposited after application of the graphite and serve to reduce or nullify the effect of the oxidizing solution on the film of hardened photosensitive substance which remains on the flange.

In one embodiment, water which has preferably been deionized is sprayed onto the flange prior to application of the photosensitive substance. It has been found that, as a result of this arrangement, the photoresist adheres more readily to the glass and a film of photosensitive substance which is more uniform and possibly of greater fineness is thus produced on the flange after UV illumination. In other words, the film of hardened photosensitive substance no longer exhibits blisters or cracks as was the case with the method of the prior technique.

It is also possible to employ water which has preferably been deionized, then sprayed onto the dried graphite layer prior to application of the oxidizing solution (for example a solution having a base of $H_2O_2$) in order to reduce the activity of said oxidizing solution on the film of hardened photoresist deposited on the flange beneath the graphite.

BRIEF DESCRIPTION OF THE DRAWINGS

Other features of the invention will be more apparent upon consideration of the following description and accompanying drawings, wherein:

FIG. 1 illustrates one step of the method in accordance with the invention;

FIGS. 2 to 4 are diagrams showing conventional steps of the method of graphite deposition on the internal face of the front panel or face-plate of a color television tube;

FIG. 5 shows one step of the method in accordance with the invention;

FIG. 6 is a diagram of said face-plate after application of the method in accordance with the invention.

DETAILED DESCRIPTION OF THE INVENTION

The front panel 10 (shown in FIG. 1) of a color television tube consists of a face-plate 11 on the internal face 12 of which are deposited the luminescent substances. The face-plate is also provided with a flange 13 which is intended to be joined to the conical portion of the tube (not shown).

For the fabrication of the screen, the initial operation consists in washing and drying the glass of the face-plate 10 which is still in the bare state. In accordance with the invention, deionized water 14 (as shown in FIG. 1) is then sprayed onto the internal face 12a of the flange 13.

After this spray application of deionized water 14 onto the internal face of the flange 13, a solution of photosensitive material 15 (shown in FIG. 2) is applied on the internal faces 12 and 12a. This photoresist 15 is then subjected to a drying operation followed in a manner known per se by exposure to ultraviolet (UV) light 16 in the locations corresponding to subsequent deposition of the phosphors. The portions 17 of the photoresist which have not been exposed to the ultraviolet radiation 16 are then hardened and insoluble in water.

The photosensitive substance 15 then undergoes a development process which consists in spraying water onto the internal faces 12 and 12a. Only the zones 17 which have been illuminated then remain (as shown in FIG. 3). However, the inventors have found that a thin layer or film 18 of hardened photosensitive material nevertheless remains at the locations which have not been purposely illuminated, especially on the internal face 12a of the flange 13. This film 18 which is of smaller thickness than the strips 17 is probably due to practically inevitable scattering of ultraviolet light toward the flange. However, by carrying out preliminary wetting of said internal face 12a of the flange 13 with deionized water 14, this film 18 is more uniform and probably thinner than a film obtained without preliminary spraying of deionized water.

Furthermore, in contrast to the prior art technique, the spray-jet 14 (shown in FIG. 1) of deionized water prevents the formation in the film 18 of bubbles or cracks which, after subsequent application of graphite, are unpleasing to the viewer's eye.

After development of the photosensitive material, a suspension of black graphite is spread over the surfaces 12 and 12a covered with strips 17 and with the film 18.

This suspension is then dried and a graphite deposit 19 (shown in FIG. 4) is obtained on the internal face of the panel 10 both on the strips 17 and between them.

After this drying operation, the invention provides for further spraying of deionized water 14 (FIG. 5) onto the graphite layer 19a which covers the internal face of the flange or skirt 13.

A solution of $H_2O_2$ is then applied on the internal faces 12 and 12a in order to destroy the strips 17 of photosensitive substance by chemical attack. After a development which consists in washing with water under pressure, these strips 17 are carried away by the water jet and entrain the graphite coating on said strips. There thus remain on the faceplate only the graphite strips 20 (FIG. 6) which have been deposited between the strips 17 or in other words between the locations 21 corresponding to subsequent deposition of the phosphors. The graphite layer 19a on the flange 13 remains of good quality by virtue of the spray application of deionized water 14 which has made it possible by dilution and, cooling to reduce the chemical activity of the $H_2O_2$ on the subjacent film 18 of photoresist.

What is claimed is:

1. A method of depositing an antireflection layer of black graphite between the phosphor strips on the internal surface of the faceplate and on the faceplate flange of a color television tube, the steps comprising:

applying deionized water to an internal surface of the flange;

applying a photosensitive substance on the internal surfaces of the faceplate and flange;

exposing the substance on the faceplate to ultraviolet radiation to harden the substance at intended locations for phosphors, wherein the prior application of deionized water to the flange ensures the formation of a uniform film of hardened material on the flange by scattered ultraviolet radiation during ultraviolet exposure;

removing the non-hardened portions of the substance;

coating the internal surfaces of the faceplate and flange with graphite;

applying an oxidizing solution to the internal surface of the faceplate to destroy the hardened strips by chemical reaction; and removing the destroyed strips and their graphite coating.

2. The method set forth in claim 1 together with the step of applying deionized water to the internal surface of the flange after the internal surfaces are coated with graphite which reduces chemical reaction of the oxidizing solution on the graphite coating located on the flange thereby preventing its destruction.

3. A method of depositing an antireflection layer of black graphite between the phosphor strips on the internal surface of the faceplate and on the faceplate flange of a color television tube, the steps comprising:

applying a photosensitive substance on the internal surfaces of the faceplate and flange;

exposing the substance on the faceplate to ultraviolet radiation to harden the substance at intended locations for phosphors, wherein ultraviolet radiation being scattered toward the flange forms a uniform film of hardened substance thereon;

removing the non-hardened portions of the substance;

coating the internal surfaces of the faceplate and flange with graphite;

applying deionized water to the internal surface of the flange;

applying an oxidizing solution to the internal surface of the faceplate to destroy the hardened strips by chemical reaction, wherein the application of deionized water to the flange reduces chemical reaction of the oxidizing solution on the graphite coating located on the flange thereby preventing its destruction;

removing the destroyed strips and their graphite coating.

4. A method according to claim 3 wherein the deionized water reduces the activity of the oxidizing solution by dilution.

5. A method according to claim 3 wherein the deionized water reduces the activity of the oxidizing solution by cooling.

* * * * *